United States Patent
Swanson et al.

(10) Patent No.: US 6,580,531 B1
(45) Date of Patent: Jun. 17, 2003

(54) METHOD AND APPARATUS FOR IN CIRCUIT BIASING AND TESTING OF A MODULATED LASER AND OPTICAL RECEIVER IN A WAVELENGTH DIVISION MULTIPLEXING OPTICAL TRANSCEIVER BOARD

(75) Inventors: Eric A. Swanson, Acton, MA (US); Ruo Ding Li, Acton, MA (US)

(73) Assignee: Sycamore Networks, Inc., Chelmsford, MA (US)

( * ) Notice: Subject to any disclaimer, the term of this patent is extended or adjusted under 35 U.S.C. 154(b) by 0 days.

(21) Appl. No.: 09/475,836

(22) Filed: Dec. 30, 1999

(51) Int. Cl.⁷ ........................... H04B 10/04; H04B 10/08
(52) U.S. Cl. ..................... 359/110; 359/161; 359/187
(58) Field of Search ................. 359/110, 161, 359/187, 194

(56) References Cited

U.S. PATENT DOCUMENTS

| | | | |
|---|---|---|---|
| 4,537,502 A | 8/1985 | Miller et al. ............... 356/5 |
| 4,709,416 A | 11/1987 | Patterson ................ 455/609 |
| 4,718,118 A | 1/1988 | Viola ..................... 455/613 |
| 5,402,433 A | 3/1995 | Stiscia ..................... 372/31 |
| 5,440,113 A | 8/1995 | Morin et al. ............. 250/205 |
| 5,953,139 A | * | 9/1999 | Nemecek et al. ......... 359/124 |
| 6,057,950 A | * | 5/2000 | Bergano ................. 359/181 |
| 6,115,157 A | * | 9/2000 | Barnard et al. .......... 359/124 |
| 6,134,034 A | * | 10/2000 | Terahara ................ 359/124 |
| 6,229,631 B1 | * | 5/2001 | Sato et al. .............. 359/110 |
| 6,433,904 B1 | * | 8/2002 | Swanson et al. ......... 359/133 |
| 6,445,471 B1 | * | 9/2002 | Shimokawa et al. ..... 359/124 |

* cited by examiner

Primary Examiner—Leslie Pascal
(74) Attorney, Agent, or Firm—Weingarten, Schurgin, Gagnebin & Lebovici LLP

(57) ABSTRACT

A method and apparatus for in-circuit biasing of a modulated laser and bit error rate testing of an optical transmitter and/or optical receiver under the control of a test controller. The test controller is communicably coupled to an interface of a module under test, as well as to external test equipment. The test controller modifies operational parameters of the modulated laser, in order to obtain a desired output power and to obtain a predetermined extinction ratio. The operational parameters of the laser include a laser bias current, an electro-absorption modulator offset bias current and a modulation depth. The disclosed test controller also determines whether the optical transmitter and/or receiver exhibit acceptable bit error rates. The disclosed test controller uses a variable optical attenuator, in combination with an erbium-doped fiber amplifier (EDFA) to control an optical signal to noise ratio for a signal terminating at either the transmitter or the receiver of the optical transceiver under test. The system measures a number of relatively low bit error rates corresponding to a number of generated signal to noise ratios and, based upon the measured values, projects a signal to noise ratio for a relatively low bit error rate so as to avoid the long period of time necessary to perform actual testing to acquire bit error rate information at high optical signal to noise ratios.

11 Claims, 8 Drawing Sheets

METHOD AND APPARATUS FOR IN CIRCUIT BIASING AND TESTING OF A MODULATED LASER AND OPTICAL RECEIVER IN A WAVELENGTH DIVISION MULTIPLEXING OPTICAL TRANSCEIVER BOARD

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The invention relates generally to the manufacture and test of optical transceivers including a modulated laser, and more specifically to an automated system and method for biasing and driving a modulated laser, such as an electro-absorptive modulated laser in an optical transceiver, in order to achieve desired operational characteristics, and for bit error rate screening of optical transmitters and receivers.

Communication devices using optical transmission technologies have been increasingly employed in recent years to satisfy the demand for large capacity digital transmission in communication networks, such as public telecommunications networks. In its basic form, an optical communication system includes a modulated laser, an optical fiber link and an optical receiver. The laser receives as an input an electrical signal in the form of a high speed serial bit stream which may include both encoded clock and data information. In response to the received serial bit stream, the laser output intensity is modulated to generate a modulated light signal which is propagated onto the optical fiber link. The light then passes through the fiber to an optical receiver which transforms the received modulated light signal into an electrical serial bit stream. The electrical signal is then amplified, conditioned, and fed to another circuit which performs clock and data recovery.

One challenge faced by manufacturers of optical communication equipment results from the fact that operational characteristics of individual lasers vary to such an extent that each laser and associated modulator must be biased individually to achieve desired power output and modulation characteristics. Existing approaches to this problem have included the manual entry of values which control the operational characteristics of the modulated laser into a non-volatile memory, such as a programmable read only memory (PROM). Such manually entered values are typically based on values provided in data sheets for each individual laser obtained from the manufacturer of the respective laser. This type of a manual process, however, is time consuming and error-prone, and can result in unacceptably high rates of mis-entry, causing operational problems. Additionally, the laser data sheet values used to determine control values for the laser modulators are not based on operational characteristics of the specific laser in the device in which it will be used. Accordingly, control values, such as a laser power bias current control vale and EA modulator bias control values, may not be optimally established in existing systems where a laser's in-circuit operational characteristics differ significantly from the characteristics specified by the manufacturer of the laser. For this reason, existing approaches, whether manual or automated, may not optimally adjust the parameters of the laser and/or receiver to the surrounding circuit.

Another problem in the manufacturing and testing of optical communication equipment relates to the testing of the optical transmitter and receiver functions to determine whether an optical transceiver meets predetermined bit error rate criteria. Where a device is required to operate with a bit error rate (BER) below some specified minimum, testing is desirable to ensure that the desired BER will be met when the transceiver is deployed in a telecommunication network. For example, an optical transceiver board may be tested to determine whether both the transmitter and receiver functions introduce errors at a rate below a threshold bit error rate. In the case where the threshold error rate is extremely low with regard to the transmission rate of the device, such testing may require weeks for each device. Such delays are highly undesirable in a manufacturing process. For example, the testing of a transceiver for a device supporting SONET OC-48 to determine whether it would meet a BER specification of less than $10^{-15}$ bits per second would require several weeks of continuous test transmissions to get a reliable estimate of the BER. Such long testing periods are costly and delay the shipments of product by the optical transceiver manufacturer. Furthermore, transceivers are often intended for use over long distance, optically amplified links. In such links, as the transmitted optical signal passes through numerous amplifiers, amplifier noise (Amplified Spontaneous Emission or ASE) accumulates. Accordingly, a performance metric for such amplified, long distance links may be thought of as the ability to maintain a maximum BER as a function of the optical signal-to-noise-ratio (OSNR) at the receiver. It would be greatly beneficial to have an automated system for characterizing transceivers during the manufacturing process as a function of OSNR that does not require multiple amplifiers, due to the costs and maintenance constraints associated with their use.

For these reasons it would be desirable to have an efficient and reliable automated method and apparatus for biasing a modulated laser used in an optical transceiver. The system should reduce the risk of errors occurring during manual entry of control values, and provide a more accurate determination of control values reflecting the actual circuit in which the modulated laser will operate. Additionally, the testing system should permit bit error rate testing down to very low levels using tests that do not involve prolonged test times.

BRIEF SUMMARY OF THE INVENTION

In accordance with principles of the invention, a system for biasing and testing an optical transceiver is disclosed. In a first aspect of the disclosed system, biasing of a modulated laser is performed under the control of a test control system. The test control system may include a computer or test controller, and the steps employed in the determination of the desired bias values are performed in response to a software program executing on the test controller. The test controller is communicably coupled to the module under test, for example, through a digital interface, such as a serial RS-232 communications link. The test controller may further be communicably connected to an optical power level monitor and other testing devices through a communication bus, such as the General Purpose Interface Bus (GPIB). Through the digital interface to the module under test, or by way of the other testing devices coupled to the test controller through the communication bus, the test controller can modify operational bias parameters of the modulated laser, in order to provide a desired extinction ratio at a desired power output level. The operational parameters may include, for example, the laser power bias current, an electro-absorption (EA) modulator bias offset voltage and an electro-absorption (EA) laser modulation depth. During operation of the disclosed system, the test controller configures the test system, establishes the laser bias current necessary to achieve a desired laser on state output power, determines a desired EA modulator bias current necessary to achieve a desired off state laser power and adjusts a modulation depth control value to achieve the desired extinction ratio.

In another aspect of the disclosed system, the test controller determines whether the optical transmitter and the optical receiver within the transceiver each exhibit an acceptable bit error rate (BER), as a function of either received optical power or received OSNR. To perform the bit error rate testing, the test controller uses a variable optical attenuator, in combination with an erbium doped optical fiber amplifier (EDFA) to control an optical signal to noise ratio (OSNR) in a signal terminating at either a reference receiver or the receiver of the optical transceiver in the module under test. A bit error rate tester is coupled to a pre-qualified transceiver module which includes a reference transmitter and the reference receiver. The reference receiver and transmitter are employed in conjunction with the transmitter and receiver of the module under test respectively to measure a number of bit error rates corresponding to controlled optical signal to noise ratios. More specifically, the generated optical signal to noise ratios are gradually increased, resulting in lower measured bit error rates. The disclosed system samples the bit error rates for a number of relatively low signal to noise ratios, and projects an optical signal to noise ratio that would be required to obtain a predetermined, relatively low bit error rate. In this manner, the disclosed system avoids the need to actually perform prolonged bit error rate measurements to verify very low bit error rates. If the projected optical signal to noise ratio for the low bit error rate is above a predetermined maximum optical signal to noise ratio, then an indication is provided that the optical transmitter or receiver being tested within the module under test has failed the test. In an alternative embodiment, the transmitted Q over the simulated amplifier link created using the generated optical signal to noise ratio can be measured as an indicator or metric of the transmitted BER quality.

Thus there is provided an efficient and reliable automated method and apparatus for biasing and testing an optical transceiver. The disclosed system reduces the risk of errors occurring during manual entry of laser bias and modulator control values and provides a more accurate determination of control values desired in the actual module in which the modulated laser well be employed. Additionally, the disclosed system allows bit error rate qualification down to very low bit error rates using tests that greatly reduce the actual test times required for each device.

BRIEF DESCRIPTION OF THE SEVERAL VIEWS OF THE DRAWING

The invention will be more fully understood by reference to the following detailed description of the invention in conjunction with the drawings, of which.

DETAILED DESCRIPTION OF THE INVENTION

Figure 1:
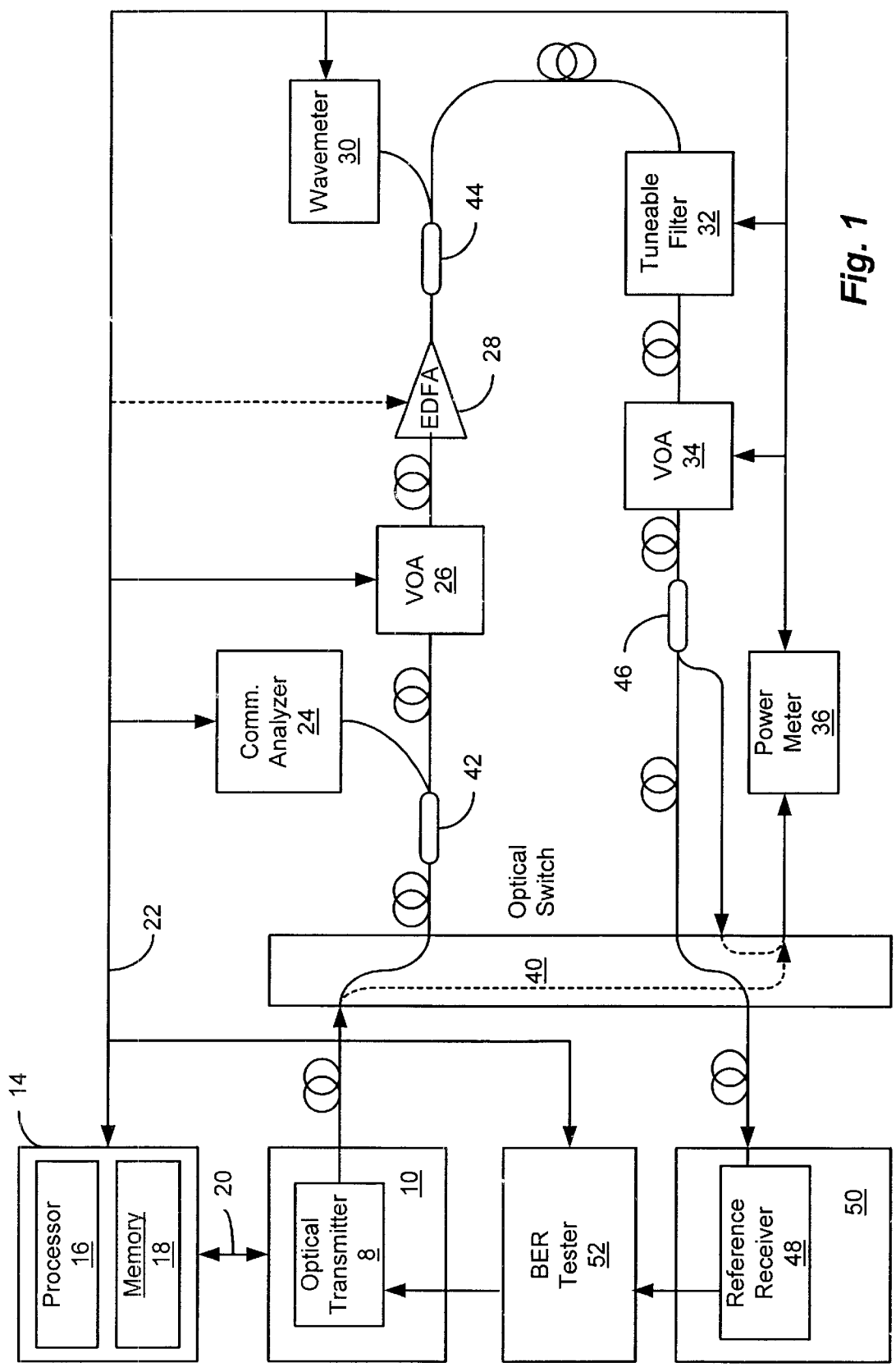
FIG. 1 is a block diagram illustrating a test system for establishing bias conditions for a modulated laser and testing optical transmitters and receivers in a module under test.

FIG. 1 illustrates a test system for establishing desired bias conditions for an optical transmitter 8 of an optical transceiver board 10. While for purposes of illustration, the module under test in FIG. 1 is shown as an optical transceiver, the disclosed system could alternatively be used to test transmitter or receiver modules. The module under test, such as the optical transceiver board 10 shown in FIG. 1, may be employed within an optical communication device (not shown) such as an optical repeater or an optical network switch.

Further in the illustration embodiment of FIG. 1, a test controller 14 is shown including a processor 16 and a memory 18. The test controller 14 is connected to the optical transceiver board 10 through an interface 20, which may consist of a serial communications interface such as an RS-232 interface, or other suitable serial or parallel communications interface. The test controller 14 is further connected to various test equipment and optical devices over a communications bus 22, such as the General Purpose Interface Bus (GPIB) or any other suitable communications bus. The test equipment and optical devices connected to the communications bus 22 include a communications analyzer 24, a first variable optical attenuator 26, an optical wavemeter 30, a tunable optical filter 32, a second variable optical attenuator 34, and an optical power meter 36.

Figure 7:
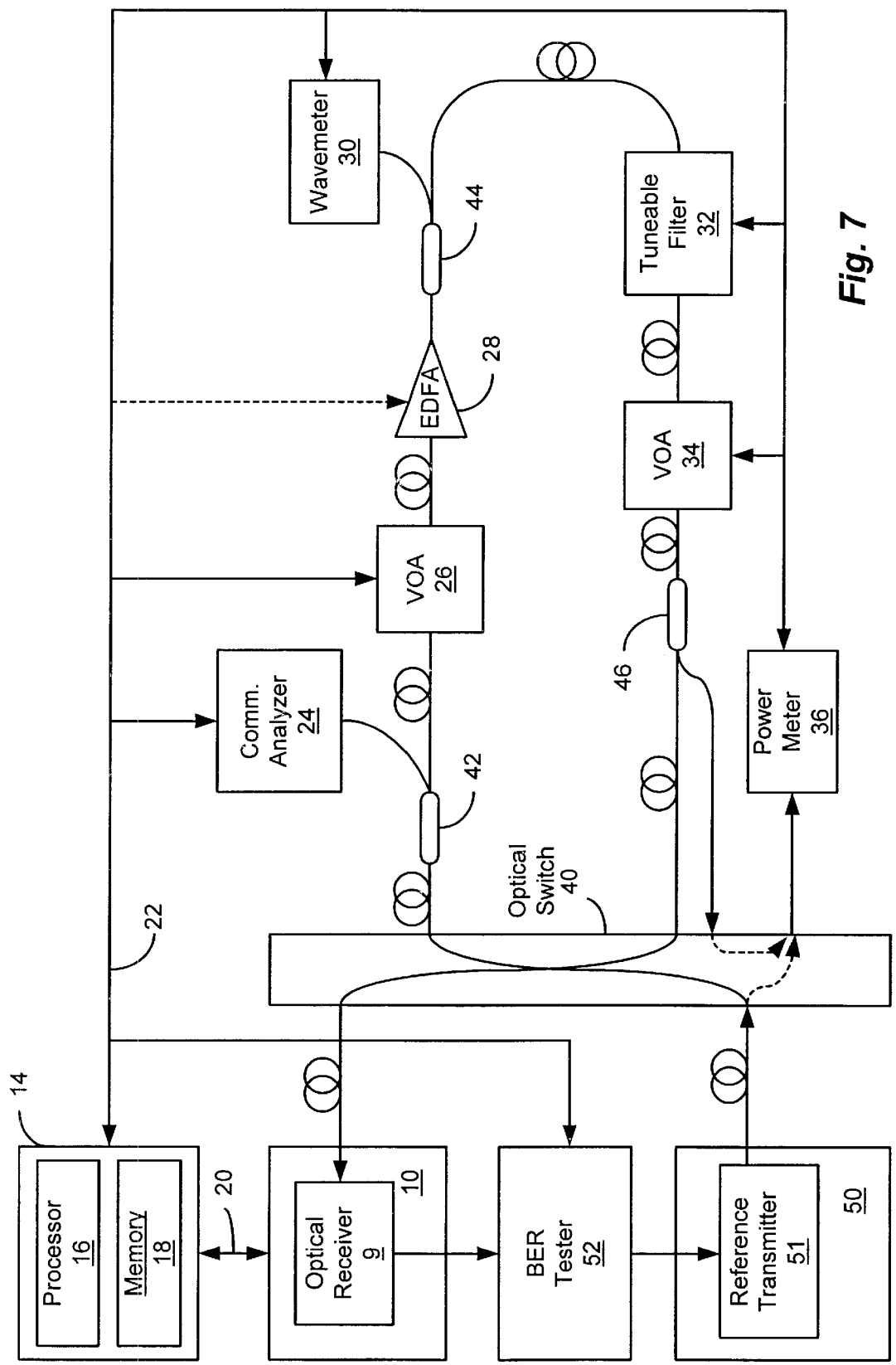
FIG. 7 shows the illustrative testing environment of FIG. 1 configured to test the bit error rate of an optical receiver in an optical communication device.

In the configuration of FIG. 1, the signal output from optical transmitter 8 is optically connected, for example by an optical fiber, to an optical switch 40, and then to an optical signal splitter 42. The optical switch 40, however, is optional, and the connections shown in FIG. 1 can alternatively be permanent, or can be manually configured. The signal splitter 42 passes a first portion of the received optical signal to the communications analyzer 24 and a second portion of the received optical signal to the first variable optical attenuator 26. As an optimization, an optical isolator may be employed between the transmitter 8 and the switch 40, or elsewhere in the optical chain to minimize the effects of optical multipath. The first variable optical attenuator 26 passes the received optical signal to an optical amplifier 28, such as an erbium doped fiber amplifier (EDFA), which operates in combination with the first variable optical attenuator to produce a desired optical signal to noise ratio. The optical amplifier 28 may optionally be controlled via the communications bus 22. The output of the optical amplifier 28 is optically coupled to a second optical signal splitter 44. The second optical signal splitter 44 passes a first portion of the received optical signal to a wavemeter 30 and a second portion of the received optical signal to the tuneable optical filter 32. The output of the tuneable optical filter 32 is coupled to the input of the second variable optical attenuator 34 via an optical fiber. The output of the second variable optical attenuator 34 is coupled to a third optical splitter 46. A first portion of the optical signal received at the third optical splitter 46 is coupled to an optical power meter 36, for example, via the appropriately configured optical switch 40, or by directly connecting a portion of the output of the third optical splitter to the optical power meter 36. A second portion of the received optical signal is coupled from the output of the third optical splitter 46 to the reference receiver 48 within the pre-qualified transceiver 50 via the optical switch 40. An advantage of connecting an output of the optical splitter 46 indirectly to the optical power meter 36, via the optical switch 46, is that such a scheme allows the optical power meter 36 to conveniently be used for other applications, such as direct measurement of the output power of the optical transceiver 10, by reconfiguring the optical switch 40. Alternatively, and as illustrated in FIG. 7, the second portion of the optical signal received by the optical splitter 46 may be connected to the receiver on transceiver card 10. While a pre-qualified transceiver 50 is illustrated in the present embodiment, it should be appreciated a standalone reference receiver 48 may be employed. The electrical output signal from the optical receiver 48 is coupled to a bit error rate tester 52. The reference receiver 48 may optionally be part of the BER tester 52. The optical signal employed may comprise a SONET OC-48 signal or any other desired optical signaling protocol and signaling rate.

Figure 2:
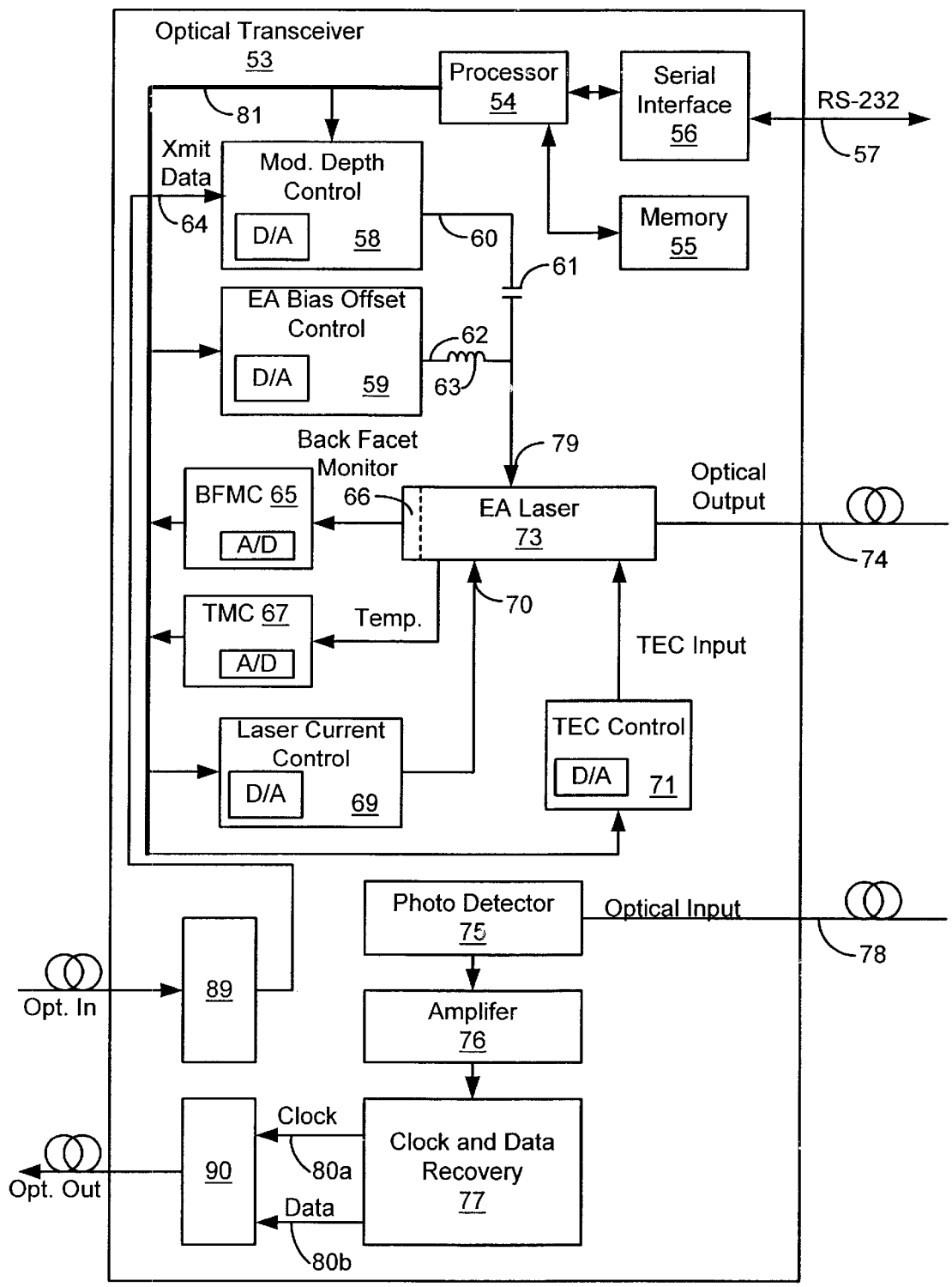
FIG. 2 shows an illustrative optical transceiver board corresponding to the module under test in the test system depicted in FIG. 1.

FIG. 2 is a block diagram illustrating the logical layout of relevant functionality in an optical transceiver board 53 which corresponds to the board under test 10 in FIG. 1. The optical transceiver board 53 includes an electro-absorption (EA) modulated laser 73 which can be biased and/or tested by the disclosed system. The optical transceiver board 53 includes a processor 54 which is coupled to a number of circuits on the optical transceiver board 53, for example by way of communications bus 81. The processor 54 is also coupled to the test controller 14 via a serial interface 56 and a serial communications link 57, which in the present embodiment is illustrated as an RS-232 serial interface shown as connection 20 in FIG. 1. Any other suitable communications interface, whether serial or parallel, may be used in combination with or as an alternative to the link 57. The test controller 14 of FIG. 1 thus has access to the various circuits coupled to the communication bus 81 via the processor 54. The communication bus 81 is coupled to a modulation depth control circuit 58, an electro-absorption bias offset control circuit 59, a back facet monitor 66 on the EA laser 73 via an analog to digital converter 65, a laser temperature monitor output on the EA laser 73 via an analog to digital circuit 67, a laser power current control circuit 69, and a thermoelectric cooling (TEC) control circuit 71. Note that in FIG. 2 A/D and D/A functionalities are shown without the conventional associated signal conditioning electronics for simplicity. The input 64 and output 80 are coupled to optical transmitter and receiver modules (WDM or otherwise) 89 and 90 respectively, and thus the input and output signals to the transceiver board under test are preferably optical. In this way, transceiver modules 89 and 90 may generate the appropriate electrical signals 64 and 80. In such an embodiment, the BER input and drive signals to module 10 on FIG. 1 are actually optical. For example, short reach standard SONET transceiver modules can be employed. Alternatively, the electrical input 64 may be provided to the Modulation Depth control circuit 58 and the electrical output signals provided as optical transceiver assembly 53 outputs.

The modulation depth control circuit 58 controls the amplitude of the modulation input signal 60 applied to the modulated laser 73. The modulation signal 69 is AC coupled to the modulation input 79 of the EA laser 73 via a capacitor 61. Additionally, the output 62 of the EA Bias Offset Control Circuit 59 is coupled to the EA laser modulation input 79 via an inductor 63. The output 62 of the EA bias offset control circuit 59 determines the DC bias offset voltage applied to the EA laser 73 and is employed generally to set the center value of the modulation applied to the EA laser 73 as is discussed in greater detail below. The sum of the outputs from the Modulation depth control circuit and the EA bias offset control circuit thus comprises the input modulation signal 79 to the EA laser 73. Note that the simple bias-T consisting of the capacitor 61 and inductor 63 may be made up of other elements, as is known in the art. Furthermore, the modulation depth controller 58 and offset controller 59 can be combined into one device thus eliminating the need to externally couple the two signals.

A back facet monitor circuit (BFMC) 65 includes an analog to digital converter that receives the output of the back facet monitor 66 of the EA laser and converts the analog back facet monitor output signal to a digital signal. The back facet monitor 66 may be employed to monitor the output power of the EA laser 73 in place of the power meter 36. Alternatively, the optical transceiver 53 may include an on-board power meter that may be employed for this purpose. The temperature monitor circuit (TMC) 67 includes an analog to digital converter that receives an analog signal indicative of the temperature of the EA laser 73 and converts the received analog signal to a digital signal. The temperature monitor is employed to determine the desired temperature of operation for the EA laser 73 at the central operating wavelength. The thermal electric cooling (TEC) control circuit 71 controls the TEC input 72 of the modulated laser 73 so as to control the temperature of the EA laser 73 and thereby maintain the transmission wavelength within parameters defined for the specific EA laser being employing. The laser power current control circuit 69 controls a laser bias current 70 applied to the EA laser 73 and is employed to establish the maximum operating power of the EA laser 73.

As described above, the EA laser 73 shown in FIG. 2 has a laser power current input 70 and an EA modulation input 79 which is voltage controlled. It should be appreciated that the inputs to the EA modulated laser may be either voltage or current controlled with appropriate modifications to the laser power control circuit 69 and the EA Bias Offset Control circuit 59, respectively.

It will also be recognized that while separate analog to digital converters 65 and 67 are shown in FIG. 2, a single analog to digital may be employed that is time multiplexed to sample the temperature output and back facet monitor 66 output of the EA laser 73.

The optical transceiver board 53 receives an optical input signal at an optical input 78 which is coupled to a photodetector 75. The photodetector 75 may, for example, be an avalanche photo-diode (APD) or a PIN photodiode, or any other suitable photodetector. The output of the photodetector 75 is an electrical signal which is coupled to an amplifier 76. The amplifier 76, containing suitable signal conditioning such as automatic gain control (AGC) and filtering, passes the amplified received signal to a clock and data recovery circuit 77. The clock and data recovery circuit produces outputs 80 including clock and data signals 80$a$ and 80$b$ respectively from the amplified received signal. As described above these signals may drive another optical transceiver, such as a low cost 1310 nm customer side interface or another WDM interface used in a WDM regenerator application.

Figure 3:
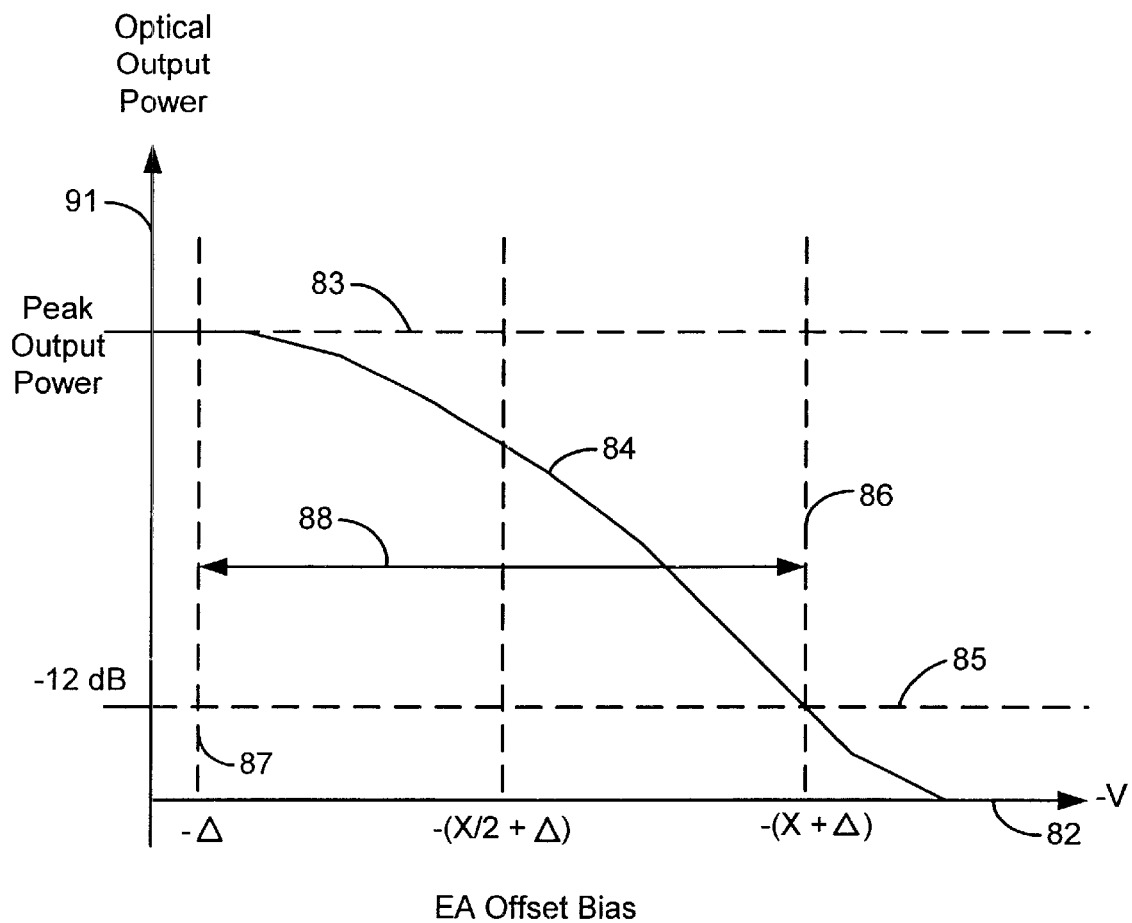
FIG. 3 is a graph showing laser optical output power as a function of electro-absorption modulator offset bias voltage.

FIG. 3 is a graph showing relative optical output power 91 of the EA laser 73 as a function of electro-absorption modulator offset bias voltage 82. There are a variety of methods to arrive at optimal laser and EA signal settings. In one embodiment, the disclosed system operates to first bias the laser in the system to establish a predetermined peak optical output power. This can be set by monitoring the power of the laser section by monitoring the back facet monitor 66 (FIG. 2). The laser power current input 70 is adjusted until the peak optical power is verified on the back facet monitor 66. The back-facet monitor 66 gain in conjunction with the BFMC circuit 65 may be characterized using conventional methods, including, for example, using a manufacturer's data sheet value for mW/mA, where mW/mA is laser power in mW vs mA of back-facet photocurrent. Alternatively, by setting the EA modulation voltage to zero and setting the EA bias voltage to zero, the desired laser output power can be read using power meter 36 with the appropriate configuration of the optical switch 40. With the modulation set to minimum or off, the electro-absorption offset bias voltage is increased in the negative direction until it reaches a value −(X+66) 86 at which point the optical output power of the laser is a predetermined fraction of the peak output power 83, for example −12 dB 85. The optical output power during this adjustment, for example, follows a curve such as curve 84 which may vary from device to device.

Because, for most common laser types, it is undesirable to apply a positive EA Offset bias to the EA laser 73, care is taken to bias the EA laser 73 such that when modulated, the EA offset bias never significantly crosses the zero axis. Otherwise, the EA section will become forward biased and its bandwidth and transmitter eye pattern and chirp may degrade. Accordingly, the EA laser bias offset is set at −(X/2×Δ) in the absence of modulation. Thus, upon the application of a modulation 88 of size X, the EA signal 79 swings from in the negative direction between −Δ and −(X+Δ). Δ is selected based on the desired system application. In general, it is desirable to get as much output power (efficiency) from the laser. Accordingly, Δ should be close to zero. However, sometimes the chirp of the transceiver will be better if Δ is approximately −0.3V.

Figure 4A:
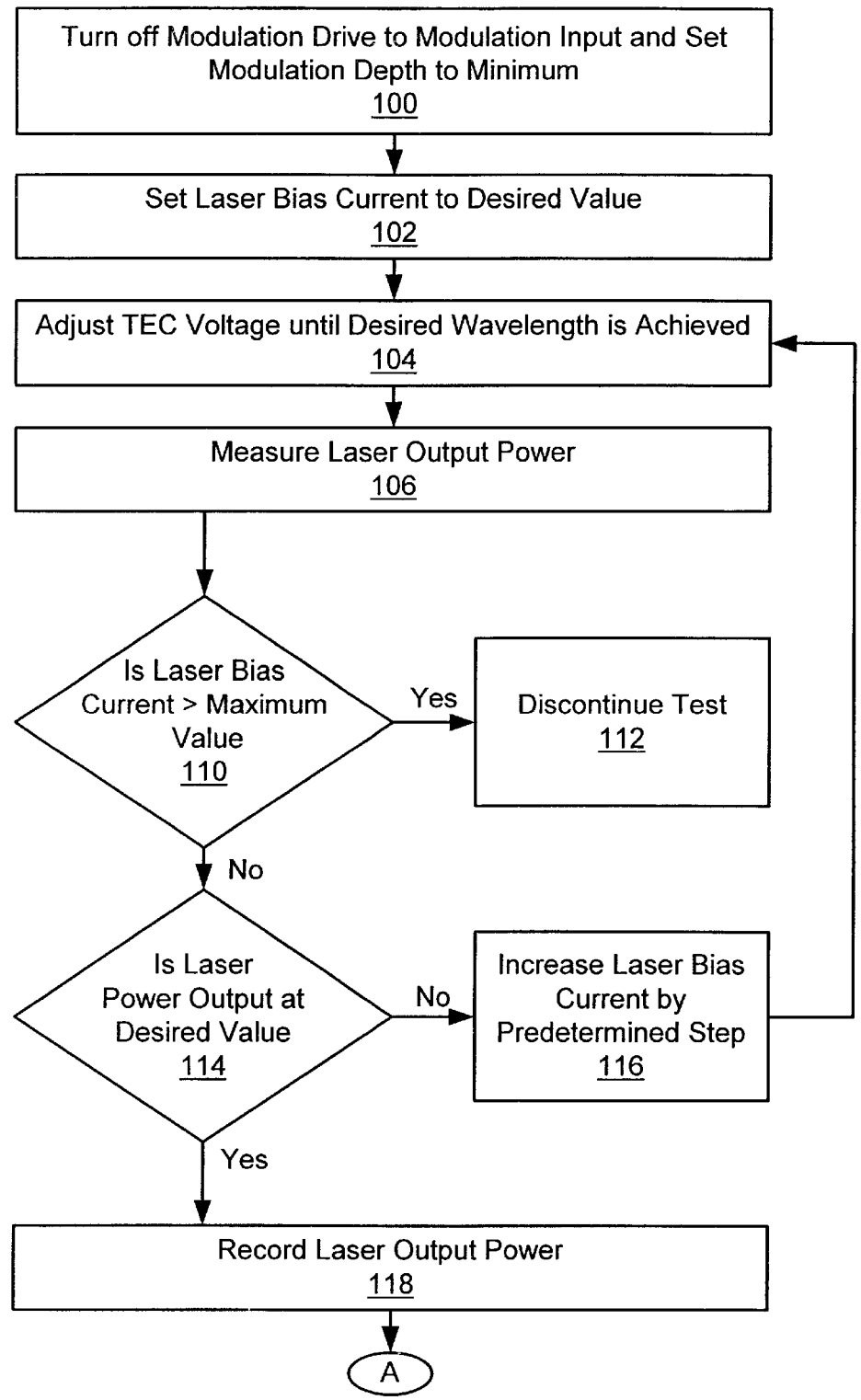
FIGS. 4a–4b illustrate steps that may be employed to establish control values for a modulated laser in an optical communication device.
Figure 4B:
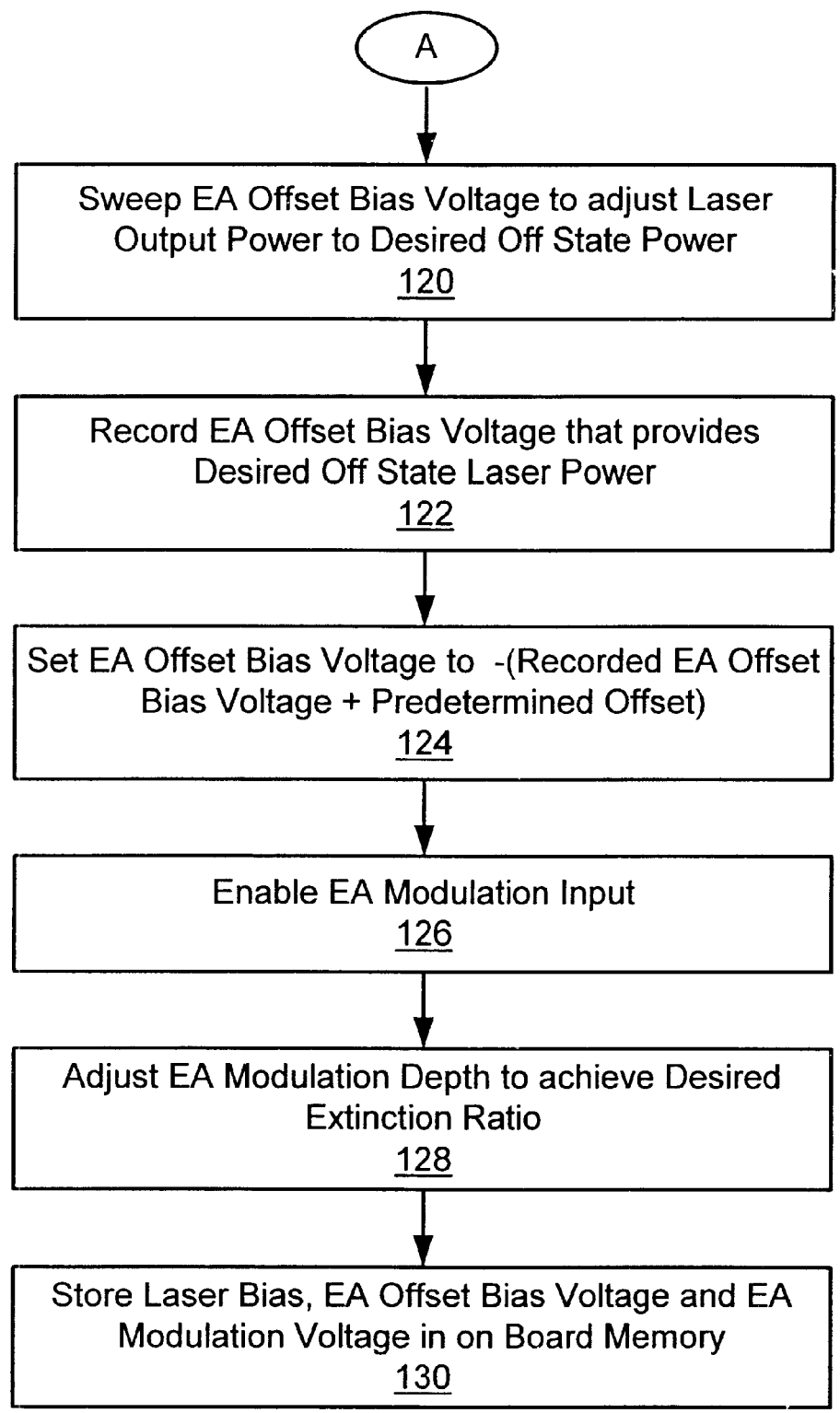

FIGS. 4a–4b show steps performed in an illustrative embodiment to perform in-circuit biasing of the EA laser 73. The steps of FIGS. 4a–4b may, for example, be performed in response to a computer program executing on the test controller 14 as shown in FIG. 1. At step 100 of FIG. 4a, the data input signal 64 to the modulated laser is turned off or the data input signal 64 is disabled, and the modulation depth control signal is set to its minimum value, resulting in a minimum modulation signal 60. For example, the transmit data signal 64 is set to a steady state and the input to the depth control circuit 58 is set to generate the minimum amplitude modulation output signal 60.

At step 102, the laser power bias current 70 of FIG. 2 is set to a desired starting laser bias current value. Typically, the starting value is selected based upon a data sheet for the device to produce a laser output power which is less than the desired final laser output power. At step 104, the TEC input 72 to the modulated laser is adjusted until the fundamental wavelength of the laser is centered on the desired frequency. The frequency is measured via the use of the wavemeter 30 and the data indicative of the measured frequency is accessed by the test controller over the bus 22 as illustrated in FIG. 1. Optionally, the transceiver 10 by have an on-board or on-chip wavelength locker circuit (not shown). In that case, the signals from the wavelength locker can be recorded (as the desired values) and stored into a memory, such as the memory 55.

At step 106, the optical output power of the laser is measured via use of the power meter 36. It should be noted that at step 106, the optical switch 40 shown in FIG. 1 may or may not be configured to pass the output of the transceiver 10 to the input of the splitter 42. For example, the optical switch may be configured such that it redirects the light from transmitter 8 on transceiver board 10 directly to the optical power meter 36. The losses in the connectors and switch may be calibrated using conventional techniques so that upon measuring the laser output power at meter 36 the measured power can be corrected to yield the actual output power of transceiver 10. Alternatively, another power meter can be coupled to splitter 42 by making it a 1×3 splitter instead of a 1×2 splitter. The data indicative of the measured power is accessed by the test controller over the bus 22 depicted in FIG. 1. At step 110, the laser power bias current is measured and compared with a predetermined maximum value. If the laser power bias current is greater than the predetermined maximum value, then step 110 is followed by step 112, in which the test is discontinued between the EA laser or some other component in the test system is defective. Otherwise, at step 114, the optical output power of the laser measured at step 106 is compared with a desired laser peak output power. If the measured optical output power of the laser is substantially equal to the desired laser peak output power, then step 114 is followed by step 118. Otherwise, step 114 is followed by step 116, in which the laser power bias current is increased (or decreased) by a predetermined increment by controlling a digital to analog converter associated with the laser current control circuit 69. Step 116 is followed by step 104. In this way, steps 104 through 114 are repeated until the desired peak output peak is reached, for example corresponding to the peak output power 83 shown in FIG. 3. At step 118, the test controller 14 records the laser power current bias value that produced the desired peak output power for the EA laser 73. Step 118 is followed by step 120 as shown in FIG. 4b. The peak output power corresponds generally to the EA laser on-state output power. As discussed above, the laser output power can be measured by optical power meter 36 or via the back facet monitor 66. If an optical power meter 36 is used for this purpose it can be used to calibrate the back facet monitor 66 to a desired value in an automatic power control loop in the BFMC circuit 65.

At step 120, the EA bias offset circuit 59, as shown in FIG. 2, is adjusted by iteratively controlling a digital to analog converter associated with that circuit and measuring the EA laser 73 output power until the optical output power of the EA laser 73 substantially equals a predetermined desired off-state power. For example, a desired off-state power may be approximately 12 dB down from the peak output power of the laser recorded at step 118, or any other appropriate proportion of the measured peak output power. At step 122, the electro-absorption offset bias voltage providing the desired off-state power is recorded as the off-state electro-absorption offset bias voltage. Next, at step 124, the center of the modulation provided by the electro-absorption modulator in the modulator laser is established by setting the EA offset bias voltage to:

$$-(\text{electro absorption off-state bias}/2+\Delta)$$

where Δ is a predetermined offset provided so that the laser does not operate with a positive EA offset bias, and minimal chirp, and this value is recorded as the operational EA offset bias voltage value. For example, a typical Δ value might be on the order of −(0.3–1.0) volt. For example, the center of the modulation is set by writing a control register in the electro-absorption bias offset control circuit 59 shown in FIG. 2. At step 126, the electro-absorption modulation input is enabled, such that input data to be transmitted 64 is applied to the modulation depth control circuit 58 and the output of the modulation depth control circuit 58 is summed with the EA bias offset control circuit 59 output. At step 128, the electro-absorption modulation depth or, otherwise stated, the amplitude of the modulation applied to the EA laser modulation input 79, is adjusted to obtain either a predetermined output drive level of X or a predetermined desired extinction ratio, which is the ratio of the optical power representing a 1 bit and the optical power representing a 0 bit. For example, the modulation depth may be adjusted by writing into a control register within the modulation depth control circuit 58 a value which produces the desired amplitude of modulation at the output 60 to obtain the specified extinction ratio. The extinction ratio is measured by the communication analyzer 24 and the measurements are accessible by the test controller over the bus 22 as illustrated in FIG. 1. At step 130, the test controller stores in a memory within the optical transceiver 53 register values which are input to the respective digital to analog converters to obtain the desired peak output power recorded at step 118, the electro-absorption operational offset bias determined at step 124, and the electro-absorption modulation voltage associated with the modulation depth obtained in step 128. For example, these values may be written into a non-volatile memory such as the memory 55 shown in FIG. 2 for loading into registers with the respective bias control circuits, and/or into non-volatile registers within the respective control circuits 58, 59 and 69 so as to permit such values to be later used during operation of the optical transceiver board when installed in an optical communications device.

Figure 5:
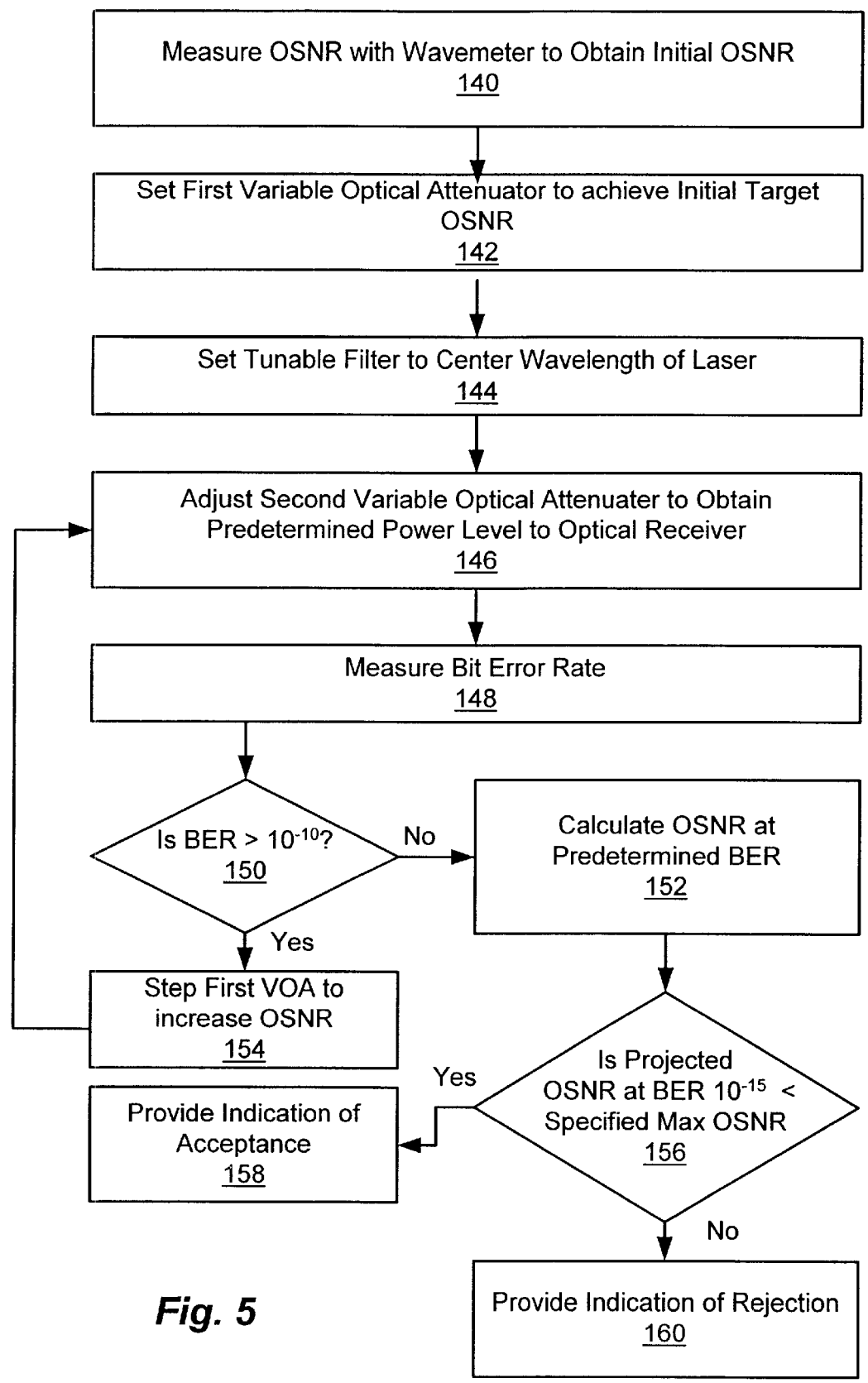
FIG. 5 illustrates steps that may be performed to ascertain a projected optical signal to noise ratio for a relatively low bit error rate of an optical transmitter or receiver in an optical transceiver.

FIG. 5 shows illustrative steps performed to perform bit error rate testing of an optical transmitter 8 (See FIG. 1) and an optical receiver 9 (See FIG. 7) within an optical transceiver 10. The steps of FIG. 5 may, for example, be performed under control of a test controller, such as the test controller 14 shown in FIG. 1. The steps of FIG. 5 may be employed to test the optical transmitter 8 of an optical transceiver 10 using the configuration shown in FIG. 1, or to test the optical receiver of a device using the configuration shown in FIG. 7, or to test a combination of both an optical transmitter and an optical receiver at the same time. For purposes of illustration, the steps of FIG. 5 are described with relation to the testing of an optical transmitter 8, as shown in the configuration of FIG. 1. In this example, the system under test is the optical transceiver board 10, and the optical communications device 50 is a pre-qualified transceiver that includes a reference receiver 48 and a reference transmitter 51 having known and acceptable reception and transmission characteristics respectively.

At step 140 of FIG. 5, an optical wavemeter, such as the wavemeter 30 shown in FIG. 1, which may for purposes of illustration be an HP 86120C or equivalent device, is used to measure an initial optical signal to noise ratio (OSNR). The initial optical signal to noise ratio is measured at step 140 with the first variable optical attenuator set by the test controller 14 to minimum attenuation and the second VOA set to a predetermined maximum necessary to prevent damage to the reference receiver. At step 142, the attenuation provided by a first variable optical attenuator (VOA) is adjusted until the wavemeter indicates that a predetermined initial optical signal to noise ratio is present on the fiber being monitored. At step 144, a tuneable optical filter, such as the tuneable filter 32 (e.g. such as those available from JDS/Uniphase or SANTEC Corporations) shown in FIG. 1, is adjusted to the central wavelength of the laser under test. Next, at step 146, a second variable optical attenuator, such as the variable optical attenuator 34 shown in FIG. 1, is adjusted until a predetermined optical power level, appropriate for the optical receiver in the test configuration of FIG. 1, is obtained on the fiber. The power level is, for example, measured using the power meter 36 as shown in FIG. 1.

At step 148, a bit error rate tester, such as the bit error rate tester 52 shown in FIG. 1, determines a current bit error rate, based on a comparison of bits transmitted by the transmitter 8 within the optical transceiver 10 and bits received by the reference receiver 48 within the reference transceiver 50. The bit error rates measured at step 148 are recorded, along with the associated optical signal to noise ratio, for later use in step 152. At step 150, the bit error rate measured at step 148 is compared with a predetermined termination level, for example $10^{-10}$ bit errors per second. This value can be decreased (e.g. $10^{-12}$) to allow better accuracy of the final projected BER at the expense of throughput time. If the measured bit error rate is less than the predetermined termination level, then step 150 is followed by step 152. Otherwise, step 150 is followed by step 154, in which the first variable optical attenuator is adjusted by a predetermined step value to increase the optical signal to noise ratio on the fiber as measured by the wavemeter 30 or other suitable OSNR measuring device or technique. Step 154 is followed by step 146. In this way, steps 146 through 154 are repeated until a number of bit error rates have been recorded in response to variations in the OSNR and the predetermined termination level bit error rate is achieved.

While the termination condition checked at step 150 is shown for purposes of illustration as comparing a current measured bit error rate with a predetermined termination bit error rate of $10^{-10}$, any suitable bit error rate may be employed. Alternatively, a predetermined termination optical signal to noise ratio may be compared with the current optical signal to noise ratio in order to terminate the loop of steps 146 through 154.

At step 152, the bit error rates measured at step 148, and their associated optical signal to noise ratios, are used to estimate an optical signal to noise ratio that will result in a predetermined bit error rate considerably less than the measured optical signal to noise ratios. For example, an optical signal to noise ratio may be projected at step 152 for a bit error rate of $10^{-15}$ bit errors per second. The estimation performed at step 152 may, for example, be performed using a least squares technique on a log(log(BER)) vs OSNR (db) scale, or any other appropriate extrapolation technique.

At step 156, the projected optical signal to noise ratio determined at step 152 is compared to a specified maximum optical signal to noise ratio for the predetermined bit error rate. If the projected optical signal to noise ratio is less than the specified maximum, then step 156 is followed by step 158, in which an indication is provided that the board under test has passed the bit error rate test. Otherwise, step 156 is followed by step 160, in which an indication is generated that the board under test has failed the bit error rate test.

Alternatively, at step 156, based upon the extrapolated bit error rate versus OSNR function, a higher OSNR could be specified than the measured OSNR values and a determination made regarding the projected bit error rate at the specified higher OSNR. If the projected bit error rate at the specified higher OSNR is below a predetermined maximum bit error rate, an indication is generated that the board has passed the test. Otherwise an indication is provided that the board under test has failed the bit error rate test.

Figure 6:
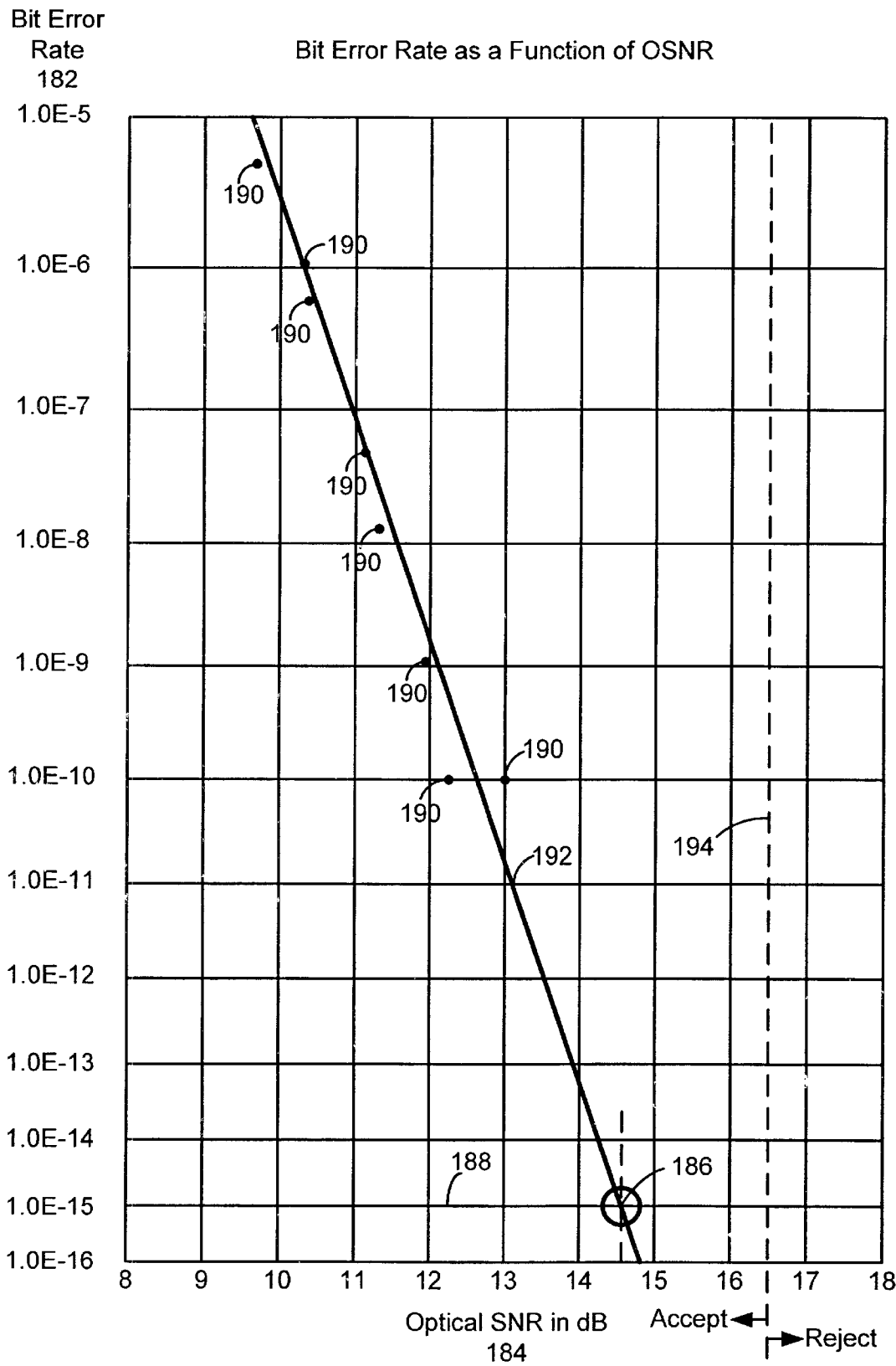
FIG. 6 is a graph illustrating bit error rates of a device under test as a function of optical signal to noise ratios.

FIG. 6 is a graph showing a measured bit error rate 182 of a device under test as a function of a controlled optical signal to noise ratio 184 and depicts the bit error rates discussed with respect to the flow diagram of FIG. 5. FIG. 6 illustrates how the disclosed system projects an estimated optical signal to noise ratio 186 for a predetermined, relatively low bit error rate 188, from a set of points 190 reflecting measured, relatively high bit error rates associated with generated optical to signal to noise ratios. As shown in FIG. 6, a line 192 is calculated using an extrapolation technique such as a laser squares fit technique (on this log(log(BER)) vs OSNR (dB), based on the points 190. The intersection of the calculated line with the predetermined, relatively low bit error rate 188 determines the projected optical signal to noise ratio 186 for that bit error rate. If the projected optical signal to noise ratio 186 is greater than a limit 194, then an indication is provided that the board under test has failed the bit error rate test. If, on the other hand, the projected optical signal to noise ratio 186 is less than the optical signal to noise ratio limit 194, then an indication is provided that the board has passed the test.

Note that an alternative to measuring the transmitter BER vs OSNR quality is to use a swept receiver threshold "Q" measurement technique. Using such a technique, it is not necessary to vary the OSNR as described above, but rather the OSNR is set at a desired operating point, such as 20 dBm in a 0.1 nm optical bandwidth. The received optical power is then set, for example to −20 dBm. Then the receiver threshold is swept out and the BER is plotted as a function of this threshold. The "Q" is then arrived at by fitting the measured data, as is conventional. If the measured "Q" is greater than the desired "Q" then the device passes.

While the above discussion focuses on measuring the quality of the transmitter into a reference receiver, the disclosed system can further be used to measure receiver performance for a reference transmitter. A corresponding graph similar to that shown in FIG. 6 can be generated to screen receivers. In addition, if the receiver has a built in adjustable decision threshold then a corresponding swept "Q" measurement can also be made on a received signal with the appropriate received signal power and OSNR, consistent with the disclosed system.

FIG. 7 shows the illustrative testing environment of FIG. 1 configured to perform bit error rate testing on an optical receiver 9 within the optical transceiver board 10. As shown in FIG. 7, the devices and connections are as depicted in FIG. 1, with the exception being that the output of a reference transmitter 51 in the reference system 50 is passed through the optical switch 40 to the input of the signal splitter 42, and one of the outputs of the signal splitter 46 is passed through the optical switch 40 to the input of the optical receiver 9 of the board under test. Additionally, as illustrated in FIG. 7, the bit error rate tester 52 drives the reference transmitter 51 and receives the received data stream from the optical receiver 9 under test. In the configuration of FIG. 7, the bit error rate tester 52 determines a current bit error rate by comparing bits transmitted from the reference system 51 and received by the receiver function 9 of the board under test.

As described above, the inputs to the receiver and/or the transmitter module 10 can be optical and the reference receiver and/or transmitter may be eliminated employing instead, the receiver and/or transmitter integrated into transceiver 10.

While the functions described herein are illustrated as being controlled by the test controller 14 it should be appreciated that such functions may be shared between the test controller 14 and the processor 54. In that event, the processor 54 may have direct or indirect access to some or all of the devices coupled to the communication bus 22.

Those skilled in the art should readily appreciate that the programs defining the functions of the test controller can be delivered to a computer in many forms; including, but not limited to: (a) information permanently stored on non-writable storage media (e.g. read only memory devices within a computer such as ROM, PROM, EEPROM or CD-ROM disks readable by a computer I/O attachment); (b) information alterably stored on writable storage media (e.g. floppy disks and hard drives); or (c) information conveyed to a computer through communication media for example using baseband signaling or broadband signaling techniques, including carrier wave signaling techniques, such as over computer or telephone networks via a modem. In addition, while the test controller functions may be embodied in computer software, the test controller functions may alternatively be embodied in part or in whole using hardware components such as Application Specific Integrated Circuits or other hardware, or some combination of hardware components and software.

While the invention is described through the above exemplary embodiments, it will be understood by those of ordinary skill in the art that modification to and variation of the illustrated embodiments may be made without departing from the inventive concepts herein disclosed. Accordingly, the invention should not be viewed as limited except by the scope and spirit of the appended claims. In particular, while the body of this disclosure has discussed EA modulated lasers, this approach also applies to directly modulated or other externally modulated laser devices.

What is claimed is:

1. A system for testing an optical transmitter, said optical transmitter having an input, said optical transmitter being operative to generate an optically modulated data signal, said system comprising:

an adjustable optical signal to noise ratio generated coupled to said optically modulated data signal;

a reference optical receiver coupled to an output of said adjustable optical signal to noise ratio generator and having an output;

a bit error rate tester operative to measure bit error rates based on said input of said optical transmitter and said output of said reference optical receiver; and a test controller communicably coupled to said bit error rate tester and said optical signal to noise generator, said test controller being operative to (i) cause said optical signal to noise generator to generate a plurality of generated signal to noise ratios, (ii) access a plurality of bit error rates measured by said bit error rate tester and corresponding to respective ones of said generated signal to noise ratios, (iii) calculate a projected optical signal to noise ratio corresponding to a predetermined bit error rate lower than said measured bit error rates, said projected optical signal to noise ratio being calculated by extrapolation from the measured bit error rates and the corresponding generated optical signal to noise ratios, and (iv) determine that said transmitter is acceptable if said projected optical signal to noise ratio at said lower bit error rate is no greater than a predetermined maximum optical signal to noise ratio.

2. The system of claim 1, wherein said adjustable optical signal to noise ratio generator includes a variable optical attenuator operative to generate a variably-attenuated version of said optically modulated data signal under the control of said test controller.

3. The system of claim 1, wherein said adjustable optical signal to noise generator comprises an erbium doped fiber amplifier.

4. A system for testing an optical receiver, said optical receiver being operative to receive an optically modulated data signal, said system comprising:

a reference optical transmitter for generating said optically modulated data signal;

an adjustable optical signal to noise ratio generator having an input coupled to said optically modulated data signal;

a bit error rate tester operative to measure bit error rates based on a signal associated with said transmitter and representative of said optically modulated data signal and an output of said optical receiver; and a test controller communicably coupled to said bit error rate tester and said optical signal to noise generator, said test controller being operative to (i) cause said optical signal to noise generator to generate a plurality of generated signal to noise ratios, (ii) access a plurality of bit error rates measured by said bit error rate tester and corresponding to respective ones of said generated signal to noise ratios, (iii) calculate a projected optical signal to noise ratio corresponding to a predetermined bit error rate lower than said measured bit error rates, said projected optical signal to noise ratio being calculated by extrapolation from the measured bit error rates and the corresponding generated optical signal to noise ratios, and (iv) determine that said receiver is acceptable if said projected optical signal to noise ratio at said lower bit error rate is no greater than a predetermined maximum optical signal to noise ratio.

5. The system of claim 4, wherein said adjustable optical signal to noise ratio generator includes a variable optical attenuator operative to generate a variably-attenuated version of said optically modulated data signal under the control of said test controller.

6. The system of claim 4, wherein said adjustable optical signal to noise generator comprises an erbium doped fiber amplifier.

7. A system for testing an optical transceiver, comprising:

an adjustable optical signal to noise ratio (OSNR) generator operative to generate a noise-added version of an optically modulated data signal coupled to an input thereof;

a bit error rate tester operative to generate a test data signal and to measure bit error rates in a received version of the test data signal appearing on an input thereof;

a reference transmitter operative to generate a reference optically modulated data signal in response to the test data signal;

a reference receiver operative to generate a reference receiver output signal in response to an optically modulated data signal coupled to an input thereof;

an optical switch operative in a transmitter-testing configuration to (i) couple to the input of the OSNR generator an optically modulated data signal generated in response to the test data signal by an optical transmitter in the optical transceiver under test, and (ii) couple the noise-added version of the optically modulated data signal to the input of the reference receiver, the reference receiver output signal being coupled to the input of the bit error rate tester when the optical transmitter in the transceiver is under test, and the switch being operative in a receiver-testing configuration to (iii) couple the noise-added version of the optically modulated data signal to an input of an optical receiver in the optical transceiver under test, an output signal of the optical receiver being to the input of the bit error rate tester when the optical receiver in the transceiver is under test, and (iv) couple the reference optically modulated data signal to the input of the OSNR generator; and a test controller communicably coupled to the bit error rate tester, the OSNR generator, and the optical switch, the test controller being operative to place the optical switch in the transmitter-testing configuration to test the transmitter in the transceiver and to place the optical switch in the receiver-testing configuration to test the receiver in the transceiver, the test controller being further operative, when testing the transmitter in the transceiver and when testing the receiver in the transceiver, to (i) cause the OSNR generator to generate a plurality of generated signal to noise ratios, (ii) access a plurality of bit error rates measured by the bit error rate tester and corresponding to respective ones of the generated signal to noise ratios, (iii) calculate a projected optical signal to noise ratio corresponding to a predetermined bit error rate lower than the measured bit error rates, the projected optical signal to noise ratio being calculated by extrapolation from the measured bit error rates and the corresponding generated optical signal to noise ratios, and (iv) determine that the transceiver under test is acceptable if the projected optical signal to noise ratio at the predetermined bit error rate is no greater than a predetermined maximum optical signal to noise ratio.

8. A system according to claim 7, wherein the predetermined bit error rate used to calculate the projected optical signal to noise ratio when testing the transmitter in the transceiver is the same as the predetermined bit error rate used to calculate the projected optical signal to noise ratio when testing the receiver in the transceiver.

9. A system according to claim 7, wherein the predetermined bit error rate used to calculate the projected optical signal to noise ratio when testing the transmitter in the transceiver is different from the predetermined bit error rate used to calculate the projected optical signal to noise ratio when testing the receiver in the transceiver.

10. A system according to claim 7, wherein the predetermined maximum optical signal to noise ratio used to determine the acceptability of the transceiver when testing the transmitter in the transceiver is the same as the predetermined maximum optical signal to noise ratio used to determine the acceptability of the transceiver when testing the receiver in the transceiver.

11. A system according to claim 7, wherein the predetermined maximum optical signal to noise ratio used to determine the acceptability of the transceiver when testing the transmitter in the transceiver is not the same as the predetermined maximum optical signal to noise ratio used to determine the acceptability of the transceiver when testing the receiver in the transceiver.

* * * * *

UNITED STATES PATENT AND TRADEMARK OFFICE
CERTIFICATE OF CORRECTION

PATENT NO. : 6,580,531 B1
DATED : June 17, 2003
INVENTOR(S) : Eric A. Swanson et al.

It is certified that error appears in the above-identified patent and that said Letters Patent is hereby corrected as shown below:

Column 1,
Line 61, "vale" should read -- value --;

Column 6,
Line 3, "69" should read -- 60 --;
Line 38, "employing" should read -- employed --;

Column 7,
Line 24, "(X+66)" should read -- (X+$\Delta$) --; and

Column 12,
Line 41, "generated" should read -- generator --.

Signed and Sealed this

Fourteenth Day of December, 2004

JON W. DUDAS
*Director of the United States Patent and Trademark Office*